(12) United States Patent
Francese

(10) Patent No.: US 9,991,848 B1
(45) Date of Patent: Jun. 5, 2018

(54) OCTAGONAL PHASE ROTATORS

(71) Applicant: International Business Machines Corporation, Armonk, NY (US)

(72) Inventor: Pier A. Francese, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 0 days. days.

(21) Appl. No.: 15/451,808

(22) Filed: Mar. 7, 2017

(51) Int. Cl.
*H03D 7/14* (2006.01)
*H03D 7/16* (2006.01)
*H03H 11/16* (2006.01)
*H03L 7/08* (2006.01)

(52) U.S. Cl.
CPC ............ *H03D 7/166* (2013.01); *H03H 11/16* (2013.01); *H03L 7/0807* (2013.01)

(58) Field of Classification Search
CPC .......... H03D 7/12; H03D 7/14; H03D 7/1425; H03D 7/1475; H03D 7/1491; H03D 7/1458; H03D 7/166; H03D 7/22; H03H 11/16
See application file for complete search history.

(56) References Cited

U.S. PATENT DOCUMENTS

| | | | | |
|---|---|---|---|---|
| 7,016,664 B2 * | 3/2006 | Souetinov | ............ | H03D 7/1441 327/214 |
| 7,616,937 B2 * | 11/2009 | Park | ........................ | H03D 7/166 455/313 |
| 7,656,986 B2 | 2/2010 | Chen | | |
| 7,961,025 B2 | 6/2011 | Rylov | | |
| 8,139,700 B2 | 3/2012 | Beukema et al. | | |
| 8,461,901 B1 * | 6/2013 | Morton | ................ | H03D 7/1441 327/355 |
| 9,306,729 B2 | 4/2016 | Bonaccio et al. | | |
| 2009/0195286 A1 | 8/2009 | Rylov | | |

OTHER PUBLICATIONS

Dickson et al., "A 1.8 PJ/BIT 16 x 16;Text{GBIS} Source-Synchronous Parallel Interface in 32 NM SOI CMOS With Receiver Redundancy for Link Recalibration", IEEE Journal of Solid-State Circuits (vol. 51, Issue: 8), May 2, 2016, pp. 1744-1755 (Abstract only).

* cited by examiner

*Primary Examiner* — An Luu
(74) *Attorney, Agent, or Firm* — Scully, Scott, Murphy & Presser, P.C.; Daniel Morris, Esq.

(57) ABSTRACT

Octagonal phase rotator includes an I-mixer having an I-DAC for steering current between positive and negative phases of an in-phase signal depending on k I-DAC control bits of a control code, a Q-mixer having a Q-DAC for steering current between the positive/negative phases of a quadrature signal depending on k Q-DAC control bits of the code, and an IQ-mixer having n IQ-mixer units each comprising an IQ-DAC for switching a second current unit between the in-phase and quadrature signals, in dependence on a respective bit of n IQ-DAC control bits, and between the positive/negative phases of the in-phase and quadrature signals via I and Q polarity switches respectively of that component. I and Q polarity switches of some different IQ-DAC components switch depending on different I-DAC control bits and Q-DAC control bits respectively. A summation circuit sums weighted output signals from the mixers to produce an output signal of phase.

16 Claims, 7 Drawing Sheets

64-state I/Q phase diagram

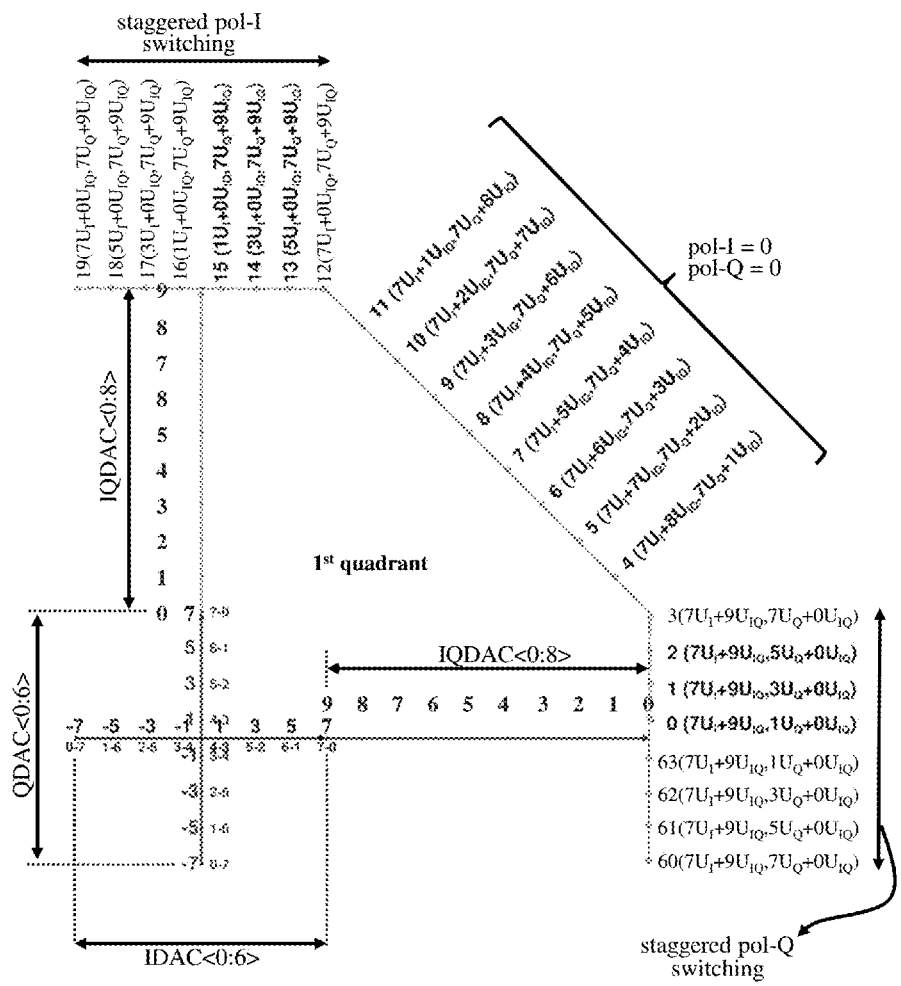
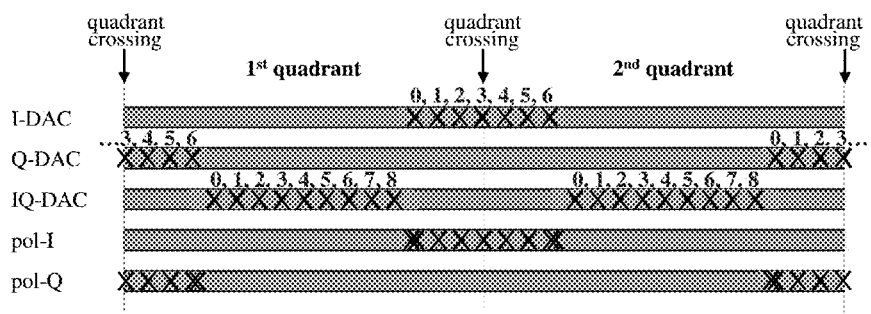
Figure 6

OCTAGONAL PHASE ROTATORS

BACKGROUND

The present invention relates generally to octagonal phase rotators.

A phase rotator is a device which produces an output signal the phase of which is dependent on a digital control code supplied to the device. Phase rotators are used, for example, in I/O (Input/Output) link transceiver circuits of data processors and communications systems to rotate the phase of an input reference clock signal to obtain an output clock signal with a desired phase for data transmission/recovery. The phase rotator apparatus typically comprises a set of DACs (digital-to-analog converters) which steer current between different phases of an I/Q (in-phase and quadrature) reference signal in dependence on particular bits of the digital control code, and a set of amplifiers which receive and weight the phases of the I/Q reference signal based on current steered to each phase by the DACs. An output circuit sums the weighted output signals from the amplifiers to produce the phase-adjusted output signal. In effect, therefore, the phase rotator operates as a current-steered mixer which generates the output signal by interpolating between the different phases of the reference signal in dependence on the input control code.

Octagonal phase rotators typically comprise three DACs, referred to herein as an I-DAC, a Q-DAC and an IQ-DAC. The I-DAC steers current between opposite polarities (positive and negative phases "P" and "N" respectively) of the in-phase (I) signal. The Q-DAC steers current between positive and negative phases of the quadrature (Q) signal. The IQ-DAC steers current between the I and Q signals, and also switches the current between the positive and negative phases of each signal. This switching is effected by I and Q polarity switches in the IQ-DAC. The rotator thus interpolates between the four phases IP, IN, QP, QN. The digital control code controls operation of the DACs such that a 360-degree phase rotation in the output signal, produced by successive incremental changes in the code, produces an octagonal phase envelope on an I/Q phase diagram representing how current is steered between the four phases. The polarity switches in the IQ-DAC are activated at quadrant crossings of the I/Q phase envelope, i.e. when the phase changes between IP and IN, or between QP and QN.

Octagonal phase rotators are described in: U.S. Pat. No. 7,961,025; "A 16-Gb/s Backplane Transceiver with 12-tap Current Integrating DFE and Dynamic Adaptation of Voltage Offset and Timing Drifts in 45-nm SOI CMOS Technology", G. R. Gangasani et al., IEEE J. Solid-State Circuits, Vol. 47, No. 8, pp. 1828-1841, 2012; and "A 16 Gb/s 3.7 mW/Gb/s 8-Tap DFE Receiver and Baud-Rate CDR With 31 kppm Tracking Bandwidth", P. A. Francese et al., IEEE Journal of Solid-State Circuits, Vol. 49, No. 11, 2014, pp. 2490-2502.

Performance of octagonal phase rotators is adversely affected by glitching transients during the phase updates, causing systematic jitter. In particular, the polarity switches in the IQ-DAC are activated every time there is a quadrant switch and cause unwanted glitches which are detrimental for dynamic performance.

SUMMARY

According to at least one embodiment of the present invention there is provided octagonal phase rotator apparatus for producing an output signal of phase dependent on a digital control code. The apparatus includes an I-mixer, a Q-mixer and an IQ-mixer. The I-mixer comprises an I-DAC for steering current between positive and negative phases of an in-phase signal in dependence on k I-DAC control bits of the code, each bit controlling switching of a first current unit between the phases, and a set of amplifiers for receiving the phases of the in-phase signal and weighting each phase, in dependence on current steered to that phase by the I-DAC, to produce a weighted output signal. The Q-mixer comprises a Q-DAC for steering current between positive and negative phases of a quadrature signal in dependence on k Q-DAC control bits of the code, each bit controlling switching of a first current unit between the phases, and a set of amplifiers for receiving the phases of the quadrature signal and weighting each phase, in dependence on current steered to that phase by the Q-DAC, to produce a weighted output signal. The IQ-mixer comprises n IQ-mixer units each comprising an IQ-DAC component for switching a second current unit between the in-phase and quadrature signals, in dependence on a respective bit of n IQ-DAC control bits of the code, and between the positive and negative phases of the in-phase and quadrature signals via I and Q polarity switches respectively of that component, and a set of amplifiers for receiving the phases of the signals and weighting each phase, in dependence on current steered to that phase by the IQ-DAC component, to produce a weighted output signal. The I and Q polarity switches of at least some different IQ-DAC components are arranged to switch in dependence on different I-DAC control bits and Q-DAC control bits respectively. The apparatus further comprises a summation circuit arranged to sum the weighted output signals from the mixers to produce the output signal.

In octagonal phase rotators embodying the invention, the polarity switches in (at least some of) the n different IQ-DAC components are controlled separately by different I-DAC or Q-DAC controls bits, and therefore switch at different times. This reduces glitching transients at quadrant crossings during rotator operation, suppressing jitter and enhancing dynamic performance.

In preferred embodiments where n>k, the I polarity switches in k of the IQ-DAC components are arranged to switch in dependence on respective bits of the k I-DAC control bits, and the I polarity switches in the remaining (n−k) IQ-DAC components are arranged to switch in dependence on different bits of the k I-DAC control bits. Similarly, the Q polarity switches in k of the IQ-DAC components are arranged to switch in dependence on respective bits of the k Q-DAC control bits, and the Q polarity switches in the remaining (n−k) IQ-DAC components are arranged to switch in dependence on different bits of the k Q-DAC control bits. This gives maximum distribution of the polarity switch switching times, and substantially inhibits glitching transients at the quadrant crossings.

In particularly advantageous embodiments, n=k and the I and Q polarity switches of all IQ-DAC components are arranged to switch in dependence on different I-DAC control bits and Q-DAC control bits respectively. All polarity switches then switch at different times for maximum jitter suppression. This fully-independent polarity switch operation can be similarly achieved in rotators with n<k.

The IQ-mixer in embodiments of the invention is implemented as an array of n IQ-mixer units, or "unit cells", of like structure, each steering one second current unit. This ensures that transistors implementing IQ-mixer units need only carry a single current unit, reducing transistor size and operational requirements. In preferred embodiments, the I- and Q-mixers are similarly implemented by an array of unit cells. In particular, the I-mixer preferably comprises k I-mixer units each comprising an I-DAC component for switching a first current unit between the positive and negative phases of the in-phase signal, in dependence on a respective bit of the k I-DAC control bits, and a set of amplifiers for receiving the phases of the in-phase signal and weighting each phase, in dependence on current steered to that phase by the I-DAC component, to produce a weighted output signal. Similarly, the Q-mixer preferably comprises k Q-mixer units each comprising a Q-DAC component for switching a first current unit between the positive and negative phases of the quadrature signal, in dependence on a respective bit of the k Q-DAC control bits, and a set of amplifiers for receiving the phases of the quadrature signal and weighting each phase, in dependence on current steered to that phase by the Q-DAC component, to produce a weighted output signal. The overall weighted output signal from each of the I- and Q-mixers may therefore comprise the set of k output signals from respective unit cells of that mixer.

The weighted output signals from the amplifiers of the mixers may be differential signals. In particular, in preferred embodiments the set of amplifiers in each I-DAC component and each Q-DAC component comprises a pair of differential amplifiers for weighting the positive and negative phases respectively to produce respective differential weighted output signals. Further, the set of amplifiers in each IQ-DAC component comprises a first pair of differential amplifiers for weighting the positive and negative phases respectively of the in-phase signal to produce respective differential weighted output signals, and a second pair of differential amplifiers for weighting the positive and negative phases respectively of the quadrature signal to produce respective differential weighted output signals. The summation circuit in such embodiments can be arranged to sum the differential weighted output signals from the mixers to produce a differential output signal. This arrangement using differential signals inhibits the effect of noise on rotator operation and improves power supply noise rejection.

At least one further embodiment of the invention provides link transceiver apparatus comprising a transmitter circuit for transmitting data over a link and a receiver circuit for receiving data from the link, wherein each of the transmitter and receiver circuits comprises octagonal phase rotator apparatus as described above.

Embodiments of the invention will be described in more detail below, by way of illustrative and non-limiting example, with reference to the accompanying drawings.

BRIEF DESCRIPTION OF THE SEVERAL VIEWS OF THE DRAWINGS

FIG. 5 indicates how current units are steered by DACs of the rotator over a quadrant of the phase envelope;

FIG. 6 indicates switching timings in the various DAC components of the rotator;

DETAILED DESCRIPTION

Figure 1:
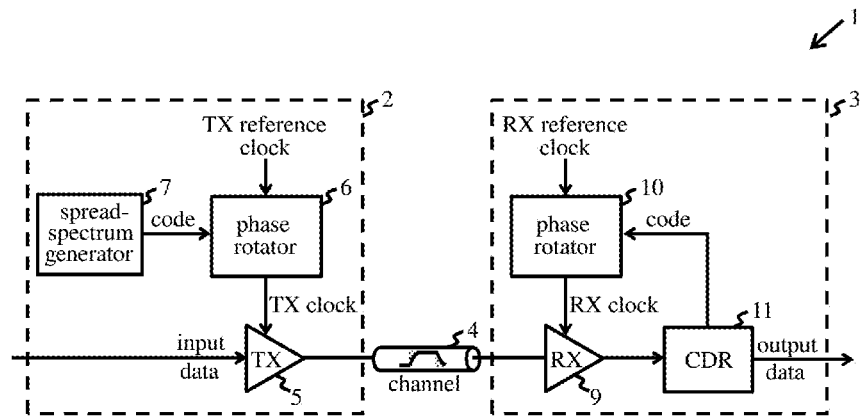
FIG. 1 is a schematic representation of I/O link transceiver apparatus.

FIG. 1 illustrates basic structure of I/O link transceiver apparatus in which phase rotators embodying the invention may be employed. The transceiver apparatus may be used, for example, in microprocessors for communications between one or more constituent processors and other components, such as external memory, GPUs (graphical processing units), FPGAs (field programmable gate arrays), ASICs (application specific integrated circuits) e.g. graphic accelerators, hard discs, adapters, etc., which are interconnected via one or more buses. The transceiver apparatus 1 includes a transmitter circuit, indicated generally at 2, and a receiver circuit, indicated generally at 3, for transmitting/receiving data via a link established over physical channel 4, e.g. an I/O bus. Transceivers in components at each end of channel 4 typically include both transmitter circuit 2 and receiver circuit 3. The transmitter side of transceiver 1 includes transmission (TX) circuitry 5 of generally known form for converting input data into analog signals transmitted over channel 4. Operation of TX circuitry 5 is controlled by a TX clock signal output by a phase rotator 6. Phase rotator 6 receives a TX reference clock signal and produces a TX clock signal with a phase dependent on a digital control code supplied by a control code generator. In this example, the control code generator is implemented by a spread-spectrum generator 7 which outputs a control code which modulates the TX clock phase to distribute signal power across a sufficiently wide frequency band to mitigate electromagnetic interference and cross-talk across channels and I/O links. On the receiver side, circuit 3 includes receiver (RX) circuitry 9 of generally known form for receiving and sampling signals from channel 4 at timings controlled by an RX clock signal from a phase rotator 10. Phase rotator 10 receives a RX reference clock signal and generates the RX clock with a phase dependent on a digital control code supplied by a control code generator implemented here by a CDR (clock-and-data recovery) circuit 11. CDR circuit 11 operates to generate the control code so that the RX clock phase is maintained aligned to that of the TX clock at the transmitter, and may also compensate for frequency offsets between the two reference clocks by continuously shifting the phase position. Implementations of CDR circuit 11 and spread-spectrum generator 7 are well known in the art and the detailed operation is orthogonal to the phase rotators described below. By way of example, transceivers with phase rotators 6, 10 described below may be used in I/O links conforming to proprietary protocols such as the NVIDIA NVLINK2 protocol or the IBM EDI (Elastic Data Interface) plus protocol, or to open communications standards such as PCIe-4 (Peripheral Component Interconnect Express 4.0). Multiple phase rotators in the receiving units may be implemented to generate clocks aligned to different phases with respect to the incoming data (e.g. one aligned to the zero-crossings and one aligned in the optimal phase to minimize the bit error rate of the received signal), and it is also common to provide a third phase rotator used in a test mode to monitor/characterize the received data at various phase positions. In a power optimized receiving unit architecture, use of a single phase rotator is preferred as discussed in the Francese et al. reference above.

Figure 2:
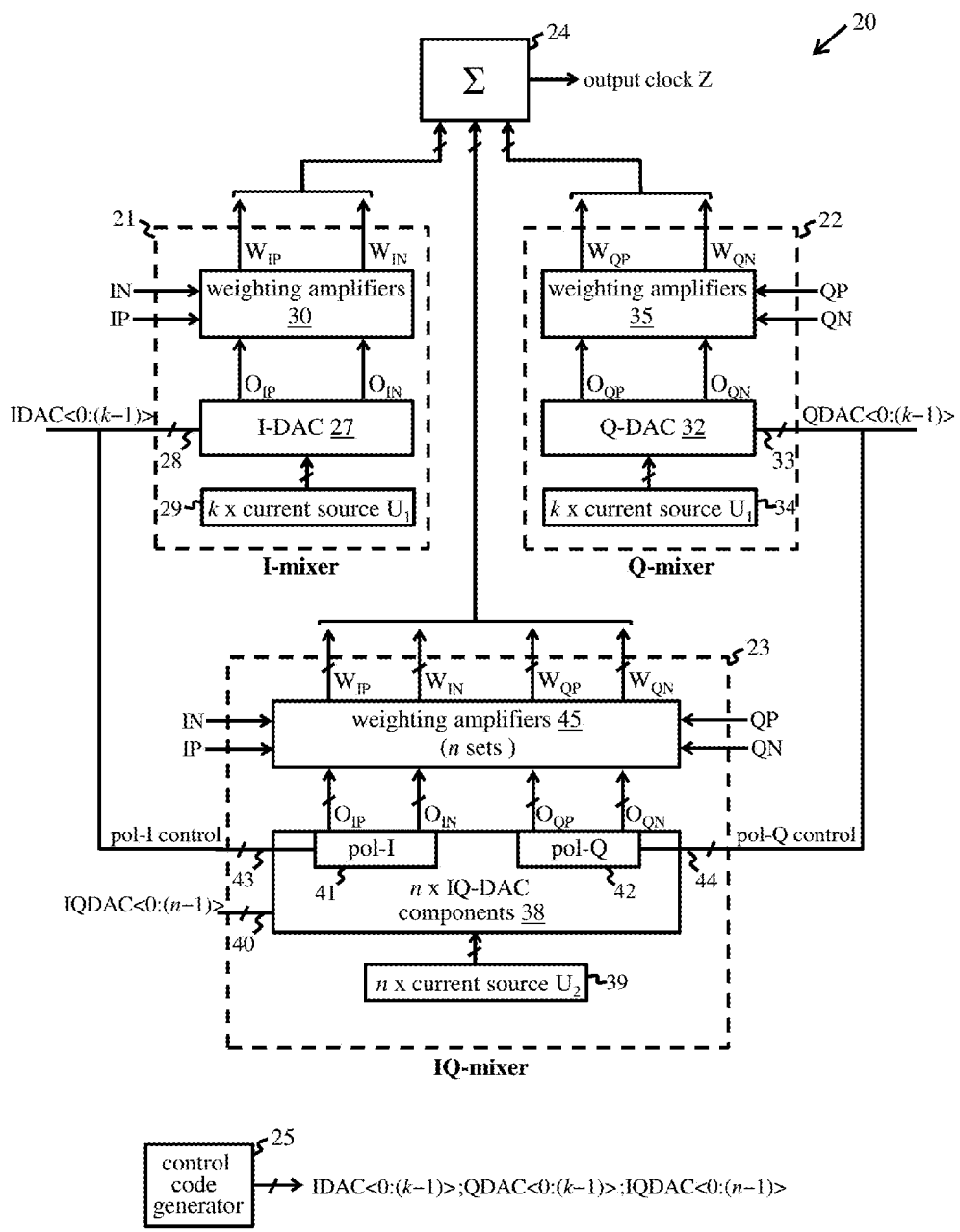
FIG. 2 is a schematic block diagram of octagonal phase rotator apparatus embodying the invention.

FIG. 2 illustrates the basic structure of an octagonal phase rotator (OPR) 20 embodying the invention. OPR 20 may be used as a phase rotator 6, 10 in the transceiver of FIG. 1. OPR 20 comprises three mixer sections 21, 22 and 23, referred to herein as an I-mixer, a Q-mixer and an IQ-mixer respectively, which provide output signals to a summation circuit 24. Each mixer 21, 22 and 23 operates as a current-steered mixer for interpolating between different phases of an I/Q reference clock signal (e.g. the TX reference clock or RX reference clock in FIG. 1) supplied to OPR 20 in operation. The I-mixer 21 interpolates between positive and negative phases IP and IN of the in-phase (I) clock signal. The Q-mixer 22 interpolates between positive and negative phases QP and QN of the quadrature (Q) clock signal. The IQ-mixer 23 interpolates between phases of both of the I and Q signals. The interpolation in each mixer is controlled by different bits of a digital control code supplied by control code generator 25 (e.g. spread-spectrum generator 7 or CDR 11 of FIG. 1) connected to the mixers 21 to 23.

I-mixer 21 includes a DAC (I-DAC 27) for steering current between positive and negative phases IP and IN of the I clock signal in dependence on a plurality (k) of I-DAC control bits, denoted here by IDAC<0:(k–1)>, of the control code. Each bit <0:(k–1)> controls switching of a first unit of current $U_1$ between the phases IP and IN. The IDAC control bits IDAC<0:(k–1)> are supplied by code generator 25 on k bit lines forming IDAC control input 28 in the figure. I-DAC 27 comprises k switches (not shown in FIG. 2) each connected to a respective one of k current sources 29 supplying a first current unit $U_1$. The output of each switch in I-DAC 27 is supplied to one of two I-DAC outputs, a positive output $O_{IP}$ or a negative output $O_{IN}$, in dependence on the state (0 or 1) of the corresponding control bit IDAC<0:(k–1)>. I-mixer 21 further comprises a set of amplifiers, indicated generally at 30, for receiving the input clock phases IP and IN and weighting each phase, in dependence on current steered to that phase by I-DAC 27, to produce a weighted output signal. In particular, positive clock phase IP is weighted based on current on positive output $O_{IP}$ of the I-DAC, and the resulting weighted output signal is supplied to I-mixer output $W_{IP}$. The negative clock phase IN is weighted based on current on negative output $O_{IN}$ of I-DAC 27, and the resulting weighted output signal is supplied to I-mixer output $W_{IN}$.

The structure of Q-mixer 22 corresponds generally to that of I-mixer 21, including a DAC (Q-DAC 32) for steering current between positive and negative phases QP and QN of the Q clock signal in dependence on k Q-DAC control bits QDAC<0:(k–1)> of the control code. Each bit <0:(k–1)> controls switching of a first current unit $U_1$ between the phases QP and QN. The control bits QDAC<0:(k–1)> are supplied by code generator 25 on k bit lines forming QDAC control input 33. Q-DAC 33 also comprises k switches (not shown) each connected to a respective one of k current sources 34 supplying a first current unit $U_1$. The output of each switch is supplied to either a positive Q-DAC output $O_{QP}$ or a negative Q-DAC output $O_{QN}$ in dependence on the state of the corresponding control bit QDAC<0:(k–1)>. Q-mixer 22 also includes a set of amplifiers 35 for receiving the input clock phases QP and QN and weighting each phase, in dependence on current steered to that phase by Q-DAC 32, to produce a weighted output signal. The positive clock phase QP is weighted based on current on positive output $O_{QP}$ of the Q-DAC, and the resulting weighted output signal is supplied to Q-mixer output $W_{QP}$. The negative clock phase QN is weighted based on current on negative output $O_{QN}$ of the Q-DAC, and the resulting weighted output signal is supplied to Q-mixer output $W_{QN}$.

The IQ-mixer 24 comprises a plurality (n) of IQ-mixer units, implemented as an array of unit cells, which collectively implement a current-steering IQ-DAC and a set of weighting amplifiers for weighting the input clock phases. In particular, the IQ-DAC is implemented by n IQ-DAC components 38 of respective mixer units. Each IQ-DAC component 38 is connected to a respective one of n current sources 39 each supplying a second unit of current $U_2$. Each IQ-DAC component 38 switches its second current unit $U_2$ between the I and Q clock signals in dependence on a respective bit of n IQ-DAC control bits, denoted by IQDAC<0:(n–1)>, of the control code. The IQDAC control bits IQDAC<0:(n–1)> are supplied by code generator 25 on n bit lines, forming control input 40, to respective IQ-DAC components 38. Each IQ-DAC component 38 also includes I and Q polarity switches (pol-I 41 and pol-Q 42 in the figure) for switching the second current unit between the positive and negative phases of the I and Q signals respectively. Pol-I switch 41 thus provides an output to one of two outputs of the IQ-DAC component, a positive I-signal output $O_{IP}$ or a negative I-signal output $O_{IN}$. Pol-Q switch 42 provides an output to either a positive Q-signal output $O_{QP}$ or a negative Q-signal output $O_{QN}$ of the IQ-DAC component. Each IQ-DAC component 38 thus steers a single current unit $U_2$ between the I and Q signals and then, via the I and Q polarity switches respectively, between the positive and negative phases of each signal.

Switching of the I polarity switches 41 and Q polarity switches 42 is controlled via pol-I control inputs 43 and pol-Q control inputs 44 respectively. The I and Q polarity switches of at least some different IQ-DAC components 38 are arranged to switch in dependence on different I-DAC control bits and Q-DAC control bits respectively. In particular, the pol-I switch 41 in each IQ-DAC component 38 is connected, via control input 43, to one of the k bit lines of I-DAC control input 28, and is thus arranged to switch in response to the corresponding IDAC control bit IDAC<0:(k–1)>. At least some of the n different pol-I switches 41 are connected to different bit lines of IDAC control input 28, and are therefore switched by different I-DAC control bits IDAC<0:(k–1)>. Similarly, the pol-Q switch 42 in each IQ-DAC component 38 is connected, via control input 44, to one of the k bit lines of Q-DAC control input 33, and is thus arranged to switch in response to the corresponding Q-DAC control bit QDAC<0:(k–1)>. At least some of the n different pol-Q switches 42 are connected to different bit lines of QDAC control input 33, and are therefore switched by different Q-DAC control bits QDAC<0:(k–1)>. Two or more (and preferably all) of the I-DAC and Q-DAC control bits <0:(k–1)> thus control different pol-I and pol-Q switches respectively.

Each of the n IQ-mixer units also includes a set of amplifiers 45 for receiving the phases of the I and Q clock signals and weighting each phase, in dependence on current steered to that phase by the corresponding IQ-DAC component 38, to produce a weighted output signal. The clock phase IP is weighted based on current on output $O_{IP}$ of IQ-DAC component 38, and the resulting weighted output signal is supplied to an output $W_{IP}$ of the IQ-mixer unit. The clock phase IN is weighted based on current on output $O_{IN}$ of the IQ-DAC component, and the resulting weighted output signal is supplied to an output $W_{IN}$ of the IQ-mixer unit. The clock phase QP is weighted based on current on output $O_{QP}$ of the IQ-DAC component, and the resulting weighted output signal is supplied to an output $W_{QP}$ of the mixer unit. The clock phase QN is weighted based on current on output $O_{QN}$ of the IQ-DAC component, and the resulting weighted output signal is supplied to an output $W_{QN}$ of the mixer unit.

The outputs $W_{IP}$, $W_{IN}$ of I-mixer 21, $W_{QP}$, $W_{QN}$ of Q-mixer 22, and the outputs $W_{IP}$, $W_{IN}$, $W_{QP}$, $W_{QN}$ of all units of IQ-mixer 23 are connected to summation circuit 24. The summation circuit 24 sums the weighted output signals from all mixers to produce an output clock signal Z. The phase of the output signal Z is dependent on the digital control code supplied by control code generator 25. OPR 20 thus operates as a four-quadrant current-steered mixer which interpolates between the clock phases IP, IN, QP, QN of the I/Q reference clock to produce the output clock signal Z with a required phase determined by the control code. As discussed earlier, a 360-degree phase rotation through all possible rotator states produces an octagonal phase envelope on an I/Q phase diagram representing how current is steered between the four clock phases. At the quadrant crossings of this phase envelope, polarity switches in the IQ-DAC components 38 are activated at different times in response to different I-DAC or Q-DAC control bits. This staggering of the polarity switching inhibits glitches at the quadrant crossings during operation of the OPR. This is explained in more detail below with reference to a preferred implementation of OPR 20.

Figure 3:
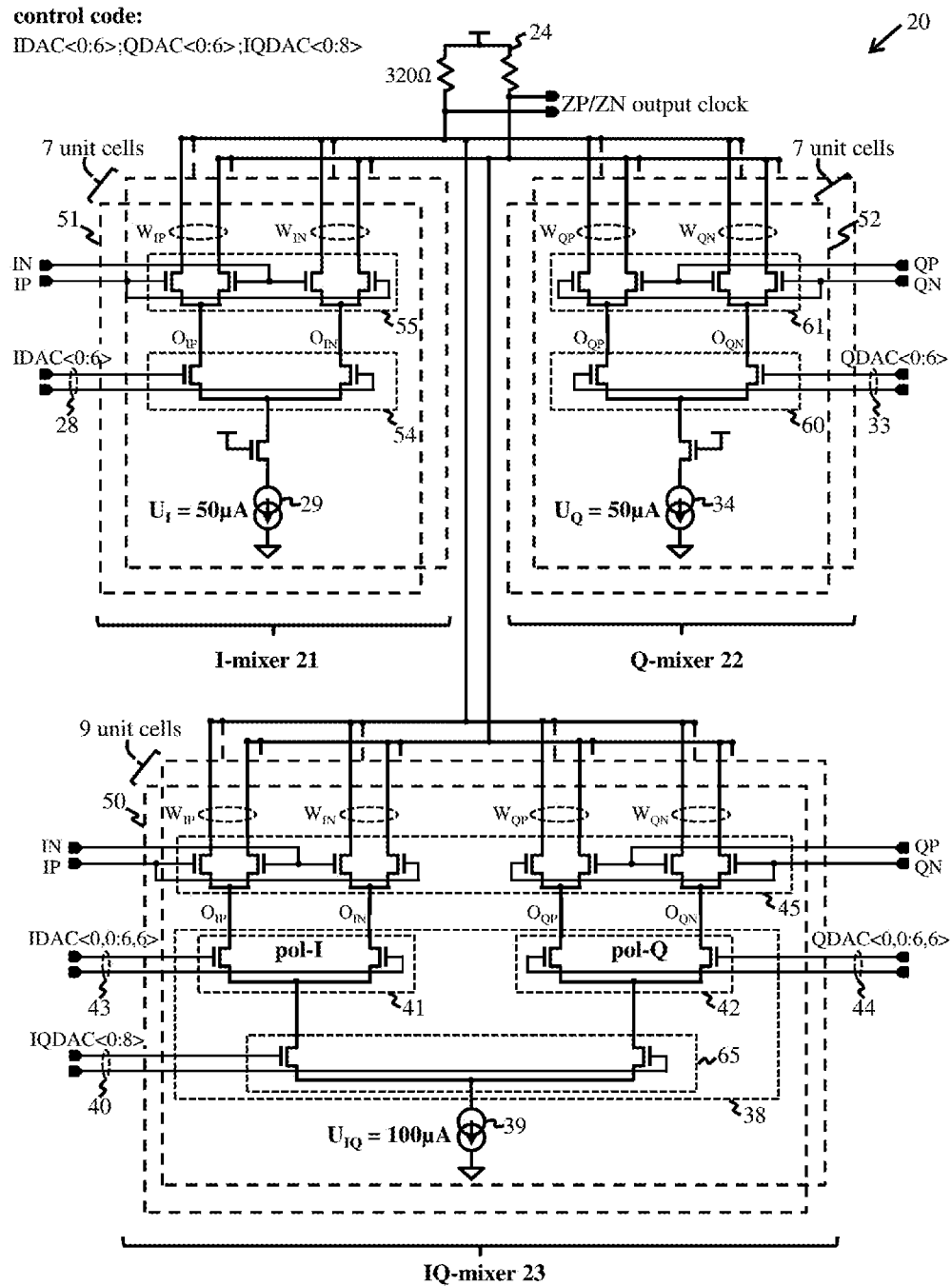
FIG. 3 illustrates a detailed implementation of the rotator apparatus of FIG. 2.

FIG. 3 is a schematic illustration of an exemplary embodiment of OPR 20. Structure corresponding to components in FIG. 2 is indicated by like reference numerals in FIG. 3. In this embodiment, all mixers 21, 22 and 23 are implemented by an array of unit cells. The IQ-mixer 23 is implemented by an array of n=9 IQ-mixer units 50. The I-mixer 21 is implemented by an array of k=7 I-mixer units 51. The Q-mixer 22 is similarly implemented by an array of k=7 Q-mixer units 52.

Each I-mixer unit 51 comprises an I-DAC component 54, in the form of a switch implemented by a differential FET (field-effect transistor) pair, which receives a first current unit, here 50 μA, from a current source 29. (The 50 μA current units steered by I-mixer 21 are denoted by $U_I$ in the following). The I-DAC switch 54 switches the current unit $U_I$ between positive and negative outputs ($O_{IP}$ and $O_{IN}$ respectively) corresponding to the positive and negative phases of the I-signal. The I-DAC switch 54 in each of the seven I-mixer units is controlled by a respective bit of the k=7 I-DAC control bits IDAC<0:6>. The transistors of differential switch pair 54 (and all further differential pairs described below) receive inputs of opposite polarity. Hence, the gate of one transistor (connected to output $O_{IP}$) of switch 54 receives the control bit IDAC<j>=0 or 1, j∈{0, 1, ... 6}, while the gate of the other transistor (connected to output $O_{IN}$) receives the inverse (1 or 0) of this control bit, whereby current unit $U_I$ is steered to output $O_{IP}$ or $O_{IN}$ depending on the control bit value. The I-mixer unit 51 also includes a set of amplifiers 55 which receive phases IP and IN of the I-signal and weight each phase in dependence on current steered to that phase by I-DAC component 54. In this embodiment, amplifier set 55 comprises a pair of differential amplifiers, implemented by FET pairs connected as shown, for weighting the phases IP and IN to produce respective differential weighted output signals. The differential amplifier connected to output $O_{IP}$ of IDAC switch 54 thus produces a (differential) weighted output signal on output $W_{IP}$. The differential amplifier connected to output $O_{IN}$ of IDAC switch 54 thus produces a (differential) weighted output signal on output $W_{IN}$. The outputs $W_{IP}$ and $W_{IN}$ of all I-mixer units 51 thus collectively provide the I-mixer outputs $W_{IP}$ and $W_{IN}$ shown in FIG. 2.

The structure of Q-mixer 22 corresponds directly to that of I-mixer 21. Hence, each Q-mixer unit 52 comprises a Q-DAC component (Q-DAC switch) 60, again implemented by a differential FET pair, which receives a first current unit of 50 μA from a current source 34. (The 50 μA current units steered by Q-mixer 22 are denoted by $U_Q$ in the following). The Q-DAC switch 60 switches the current unit $U_Q$ between positive and negative outputs $O_{QP}$ and $O_{QN}$ corresponding to the positive and negative phases of the Q-signal. Each Q-DAC switch 60 is controlled by a respective bit of the k=7 Q-DAC control bits QDAC<0:6>. The Q-mixer unit 52 also includes amplifier set 61, comprising a pair of differential amplifiers, which receive and weight phases QP and QN of the Q-signal, based on current on Q-DAC switch outputs $O_{QP}$ and $O_{QN}$ respectively, to produce respective differential weighted output signals on outputs $W_{QP}$ and $W_{QN}$.

In the mixer units 50 of IQ mixer 23, IQ-DAC component 38 comprises an IQ-DAC switch 65, again implemented by a differential FET pair, which receives a second current unit, here of 100 μA, from a current source 39. (The 100 μA current units steered by IQ-mixer 23 are denoted by $U_{IQ}$ in the following). The IQ-DAC switch 65 switches the current unit $U_{IQ}$ between outputs, corresponding to the I and Q-signals, which supply the current unit to the I polarity switch 41 or Q polarity switch 42 respectively. Each IQ-DAC switch 65 is controlled by a respective bit of the n=9 IQ-DAC control bits IQDAC<0:8>. The pol-I switch 41 and pol-Q switch 42 are each implemented by a differential FET pair. Pol-I switch 41 switches the current unit $U_{IQ}$ between the positive and negative I-signal outputs $O_{IP}$ and $O_{IN}$. Pol-Q switch 42 switches the current unit $U_{IQ}$ between the positive and negative Q-signal outputs $O_{QP}$ and $O_{QN}$.

In k=7 of the n=9 IQ-DAC components 38, the I polarity switches 41 are arranged to switch in dependence on respective bits of the k=7 I-DAC control bits IDAC<0;6>. In the remaining (n−k)=2 IQ-DAC components 38, the I polarity switches 41 are arranged to switch in dependence on different bits of the k I-DAC control bits. Similarly, the Q polarity switches 42 in seven of the nine IQ-DAC components 38 (which need not be the same seven as for the I-polarity switches) are arranged to switch in dependence on respective bits of the seven Q-DAC control bits QDAC<0;6>, and the Q polarity switches in the remaining two IQ-DAC components 38 are arranged to switch in dependence on different bits of the seven Q-DAC control bits. Hence, the pol-I switch 41 in each of seven IQ-DAC components 38 is connected, via control input 43, to a respective one of the seven (differential) bit lines of I-DAC control input 28. In the remaining two IQ-DAC components 38, the pol-I switches 41 are connected, via control input 43, to different bit lines of I-DAC control input 28. Similarly, the pol-Q switch 42 in each of seven IQ-DAC components 38 is connected, via control input 44, to a respective one of the seven bit lines of Q-DAC control input 33. In the remaining two IQ-DAC components 38, the pol-Q switches 42 are connected, via control input 43, to different bit lines of Q-DAC control input 33. In the particular example here, the nine pol-I switches 41 of the IQ-mixer units are connected to receive I-DAC control bits IDAC<0,0;6,6> as indicated at control inputs 43. Similarly, the nine pol-Q switches 42 are connected to receive Q-DAC control bits QDAC<0,0;6,6> as indicated at control inputs 44.

The amplifier set 45 in each IQ-mixer unit 50 comprises two pairs of differential amplifiers connected as shown. The two amplifiers of the first pair receive and weight the (differential) signals of phases IP and IN respectively, based on current on pol-I switch outputs $O_{IP}$ and $O_{IN}$ respectively, and produce respective differential weighted output signals on outputs $W_{IP}$ and $W_{IN}$. Similarly, the two amplifiers of the second pair receive and weight the (differential) signals of phases QP and QN respectively, based on current on pol-Q switch outputs $O_{QP}$ and $O_{QN}$ respectively, and produce respective differential weighted output signals on outputs $W_{QP}$ and $W_{QN}$.

The (differential) outputs $W_{IP}$, $W_{IN}$, $W_{QP}$, $W_{QN}$ of all mixer units 50, 51 and 52 are connected to summation circuit 24 which is implemented here as a shared load comprising two 320Ω resistors. The circuit 24 thus sums the weighted output signals from all mixers to produce a (differential) weighted output signal ZP/ZN (where the components ZP, ZN are of opposite polarity, ie., 180 degrees out of phase).

The phase of the output clock signal ZP/ZN varies with changes in the control code (IDAC<0:6>;QDAC<0:6>;IQ-DAC<0:8>) to define an octagonal phase envelope. Successive phase states of OPR 20 are obtained by changing one bit at a time of the control code. Each bit flip switches one unit of current in one of I-DAC switches 54, Q-DAC switches 60 or IQ-DAC switches 65. All switches are operated sequentially in each DAC, and the DACs of different mixers 21 to 23 are also operated sequentially. The I-mixer 21 contains seven I-DAC switches 54, providing eight different switch configurations (I-DAC states) with successive bit-flips from all-zero control bits IDAC<0:6> to all-one control bits IDAC<0:6>. The seven Q-DAC switches 60 similarly give eight different switch configurations (Q-DAC states) with successive bit-flips from all-zeros to all-ones. IQ-mixer 23 contains nine IQ-DAC switches 65 and thus provides ten different switch configurations (IQ-DAC states) with successive bit-flips in IQ-DAC<0:8> from all-zeros to all-ones. This, together with operation of polarity switches 41 and 42, provides switch operation based on segmented thermometer coding, giving a 64-state OPR whose phase states define the octagonal phase envelope illustrated schematically in FIG. 4.

Figure 4:
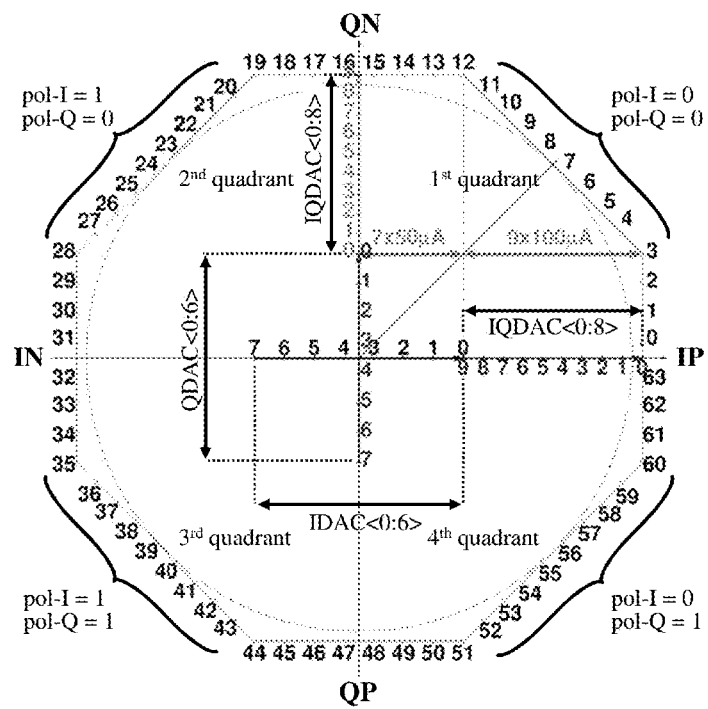
FIG. 4 shows the octagonal phase envelope produced by the rotator of FIG. 3.

The I/Q phase diagram of FIG. 4 indicates how current is steered between the four reference clock phases IP, IN, QP and QN due to the different switch configurations produced by the control code. The 64 rotator states are labelled 0 to 63 around the octagonal phase envelope. Successive rotator states are obtained by changing one bit of the control code. The eight different I-DAC states obtained from IDAC<0:6> are labelled 0 to 7 along the I-axis. Successive bit-flips in IDAC<0:6> switch one current unit $U_I$=50 μA from phase IP to phase IN. In I-DAC state 0, all seven current units $U_I$ are steered to IP. In state 1, six units $U_I$ are steered to IP and one unit $U_I$ is steered to IN, giving a resultant $5U_I$ to IP. In state 2, five units $U_I$ are steered to IP and two units $U_I$ are steered to IN, giving a resultant $3U_I$ to IP, and so on up to state 7 in which all seven units $U_I$ are steered to IN. The change from state 3 to state 4 corresponds to a quadrant crossing on the phase diagram where the net one current unit $U_I$ switches from IP to IN.

Similarly, the eight different Q-DAC states obtained from QDAC<0:6> are labelled 0 to 7 along the Q-axis. Successive bit-flips in QDAC<0:6> switch one current unit $U_Q$=50 μA from phase QN to phase QP. Hence in Q-DAC state 0, all seven current units $U_Q$ are steered to QN, with successive bit-flips changing the net current by $2U_Q$ until state 7 in which all seven units $U_Q$ are steered to QP. The change from state 3 to state 4 corresponds to a quadrant crossing where the net one current unit $U_Q$ switches from QN to QP.

The IQ-DAC operates in each quadrant of the phase diagram when the I-DAC is either in state 0 or state 7 and the Q-DAC is either in state 0 or state 7. The ten different IQ-DAC states obtained from IQDAC<0:8> are labelled 0 to 9 along the +I-axis (IP) and −Q-axis (QN). (The IQ-DAC states on −I and +Q are omitted in the figure for clarity). Successive bit-flips in IQDAC<0:8> switch one current unit $U_{IQ}$=100 μA between an I phase and a Q phase. The polarities of the I and Q phases here depend on the states of the polarity switches pol-I and pol-Q. The states of the polarity switches when the IQ-DAC operates in each quadrant are indicated in the figure. When the IQ-DAC operates in the first quadrant (IP-QN) of the phase diagram, all I polarity switches pol-I 41 are in state 0, steering current to output $O_{IP}$ in FIG. 3, and hence to phase IP. All Q polarity switches pol-Q 42 are also in state 0, steering current to output $O_{QN}$ in FIG. 3, and hence to phase QN. The steering of current between phases in the other quadrants follows from the indicated states of the polarity switches. In IQ-DAC state 0, all nine current units $U_{IQ}$ are steered to the I signal (all IQ-DAC switches 65 steering their current unit $U_{IQ}$ to pol-I switch 41 in FIG. 3). In IQ-DAC state 1, eight units $U_{IQ}$ are steered to I and one unit $U_{IQ}$ is steered to Q, and so on up to state 9 in which all nine units $U_{IQ}$ are steered to Q.

The resulting current-steering operation of OPR 20 can be understood from FIG. 5. This indicates the total current contributions of the DACs to the I and Q signal phases for rotator states in, and bridging the quadrant crossings of, the first quadrant. In rotator state 0, I-DAC is in state 0, with $7U_I$ (allocated 7-0 between IP-IN) steered to IP. The IQ-DAC is in state 0, with $9U_{IQ}$ steered to I and $0U_{IQ}$ steered to Q. All nine pol-I switches are set to state 0, steering to IP, by control bits IDAC<0,0:6,6> since all bits of IDAC<0:6> are equal. The Q-DAC is in state 3, with $1U_Q$ (allocated 4-3 between QN-QP) steered to QN. The resulting current steered to phases IP and QN, denoted (IP, QN), is made up as ($7U_I$+$9U_{IQ}$, $1U_Q$+$0U_{IQ}$) as indicated. In rotator state 2, the I-DAC and IQ-DAC currents are unchanged, but Q-DAC switches to state 2 with $3U_Q$ (allocated 5-2 between QN-QP) steered to QN. The resulting current steered to (IP, QN) is made up as ($7U_I$+$9U_{IQ}$, $3U_Q$+$0U_{IQ}$). The Q-DAC changes to its successive states 1 and 0 for rotator states 2 and 3 (the I-DAC and IQ-DAC currents being unchanged), giving (IP, QN) currents ($7U_I$+$9U_{IQ}$, $5U_Q$+$0U_{IQ}$) and ($7U_I$+$9U_{IQ}$, $7U_Q$+$0U_{IQ}$) respectively.

For the subsequent rotator states up to state 12, the I-DAC and Q-DAC states are unchanged, and the IQ-DAC takes over, switching through its successive states 1 to 9. In rotator states 3 to 12, all nine pol-Q switches are set to state 0, steering to QN, by control bits QDAC<0,0:6,6> since all bits of QDAC<0:6> are equal. All nine pol-I switches are still set to state 0, steering to IP. Hence, in rotator state 4, the IQ-DAC switches to its state 1, with $8U_{IQ}$ steered to IP and $1U_{IQ}$ steered to QN. In each subsequent rotator state 5 to 12, the IQ-DAC switches one further $U_{IQ}$ from IP to QN until all nine $U_{IQ}$ are steered to QN in rotator state 12.

In the subsequent rotator states 13 to 19, current steered by the Q-DAC and IQ-DAC remains unchanged, and the I-DAC takes over, switching back up through its successive states 1 to 7. With each state-change here, one bit of IDAC<0:6> changes and $1U_I$ is switched from IP to IN, giving the current contributions indicated. The quadrant crossing occurs between rotator states 15 and 16, where the net $1U_I$ is switched from the IP side to the IN side. The bit changes in IDAC<0:6> between rotator states 12 and 19 gradually change the states of the pol-I switches 41 in the IQ-DAC controlled by IDAC<0,0:6,6>. IDAC<0> thus switches the first two pol-I switches to state 1, steering to output $O_{IN}$ in FIG. 3 and hence to phase IN. IDAC<1> to IDAC<5> switch the next five pol-I switches to state 1, steering to IN. IDAC<6> switches the last two pol-I switches to state 1, steering to IN. The pol-I switching is thus staggered as far as possible at the quadrant crossing. Note also that the IQ-DAC is steering all current to the Q signal, and none to the I signal, in rotator states 12 to 19. No current is therefore flowing through the pol-I switches during the staggered switching process.

The staggered switching of the I-pol switches occurs again in reverse between rotator states 44 and 51, when all current is steered to QP (and none to the I-signal) by the IQ-DAC. The pol-Q switches 42 in the IQ-DAC are similarly switched in a staggered manner at the quadrant crossings between QN and QP. For example, in rotator states 60 to 63 and 0 to 3, the I-DAC is steering all $7U_I$ to IP, and the IQ-DAC is steering all $9U_{IQ}$ to IP. In state 60, the Q-DAC is in state 7, steering all $7U_Q$ to QP. All nine pol-Q switches 42 are set to state 1, steering to QP, by control bits QDAC<0, 0:6,6> since all bits of QDAC<0:6> are equal. In each subsequent rotator state 61 to 63 and 0 to 3, the Q-DAC switches down through its successive states 6 to 0. With each state-change here, one bit of QDAC<0:6> changes and $1U_Q$ is switched from QP to QN, giving the current contributions indicated. These bit changes in QDAC<0:6> gradually switch the nine pol-Q switches, controlled by QDAC<0,0: 6,6>, to state 0, with the first and last bits QDAC<0> and QDAC<6> each switching two pol-Q switches, and QDAC<1> to QDAC<5> each switching one pol-Q switch. No current is flowing through the pol-Q switches during this staggered switching process since the IQ-DAC is steering all current to the I signal.

The switching process described above is indicated schematically in the switch timing diagram of FIG. 6. This shows relative switching times for individual switches 54, 60 and 65 in the I-DAC, Q-DAC and IQ-DAC, and for the polarity switches pol-I and pol-Q in response to their corresponding control bits. Each cross represents switching of a single switch, with double crosses representing simultaneous switching of two polarity switches.

The above embodiment provides an OPR with exceptional performance. Each transistor in the unit cell structure need only switch a single current unit, reducing transistor size and operational requirements, e.g. as to: monotonicity (ensured by the thermometer coding); matching (physical implementation as step-and-repeat copies); and electro-migration (the metal routing is local to the unit cells and shorter routing suffers less from electro-migration). Most importantly, the staggered polarity switching substantially eliminates glitching transients due to polarity switching during rotator operation. This suppresses systematic clock jitter, e.g. when the OPR rotates because of a frequency offset, significantly improving dynamic performance. The improvement in performance is clearly demonstrated by simulation results, illustrated in FIG. 7a through 9, which compare the above embodiment with the prior octagonal phase rotator of the Francese et al., reference given earlier.

Figure 7A:
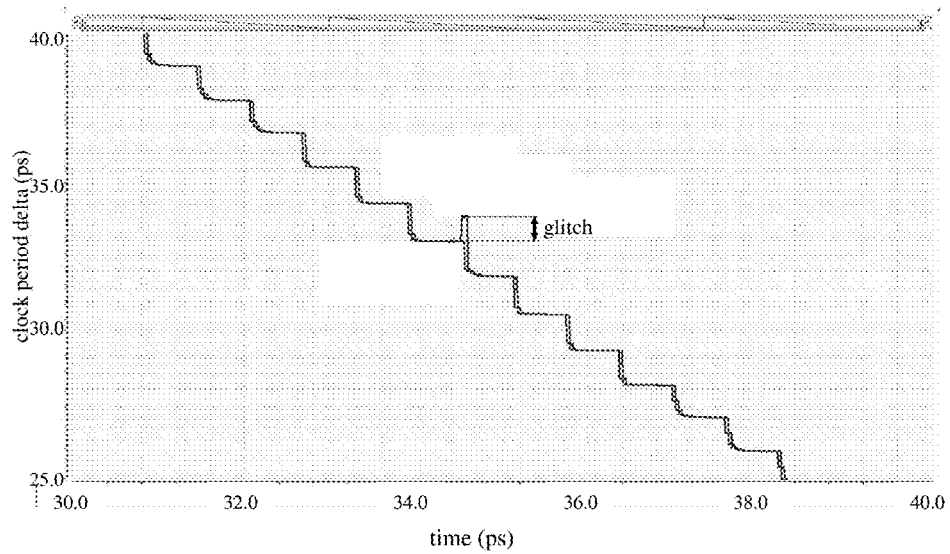
FIGS. 7a and 7b compare glitching transients in operation of a prior rotator and the rotator of FIG. 3.
Figure 7B:
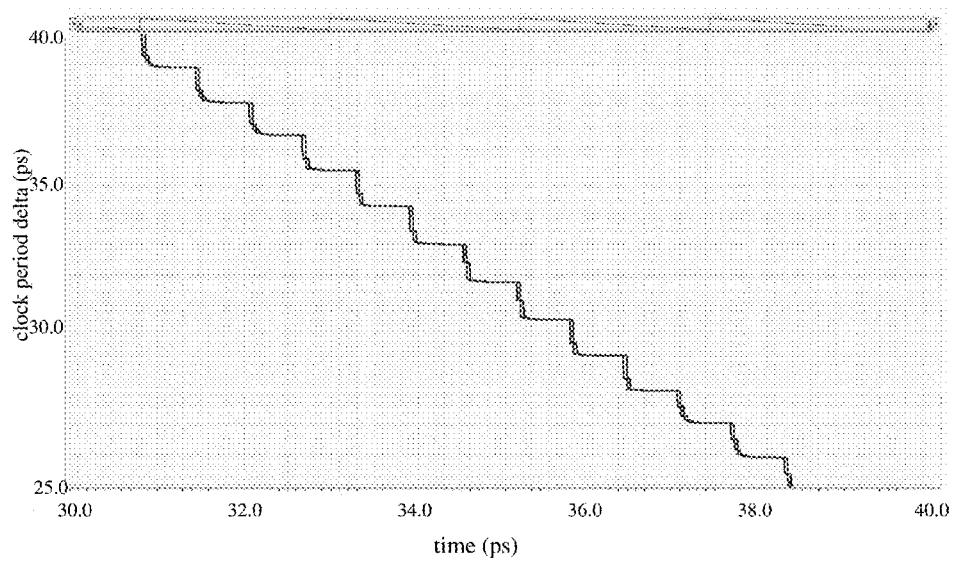

FIG. 7a illustrates the step-wise changes in the period of the output clock signal from the prior rotator as the clock phase is changed in unitary steps through successive rotator states bridging a quadrant crossing. (The two traces correspond to the clock phase rising edge (ZP) and falling edge (ZN) of the differential output signal). The significant phase glitch at the quadrant crossing is clearly evident. FIG. 7b shows the corresponding results for the OPR embodiment described above. The glitch at the quadrant crossing has been completely eliminated.

Figure 8A:
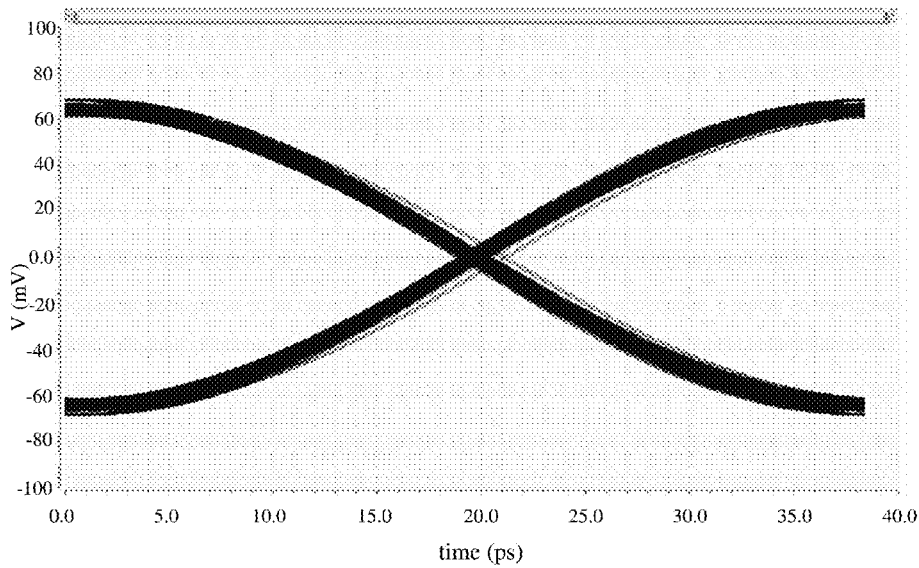
FIGS. 8a and 8b compare jitter produced in operation of the two rotators.
Figure 8B:
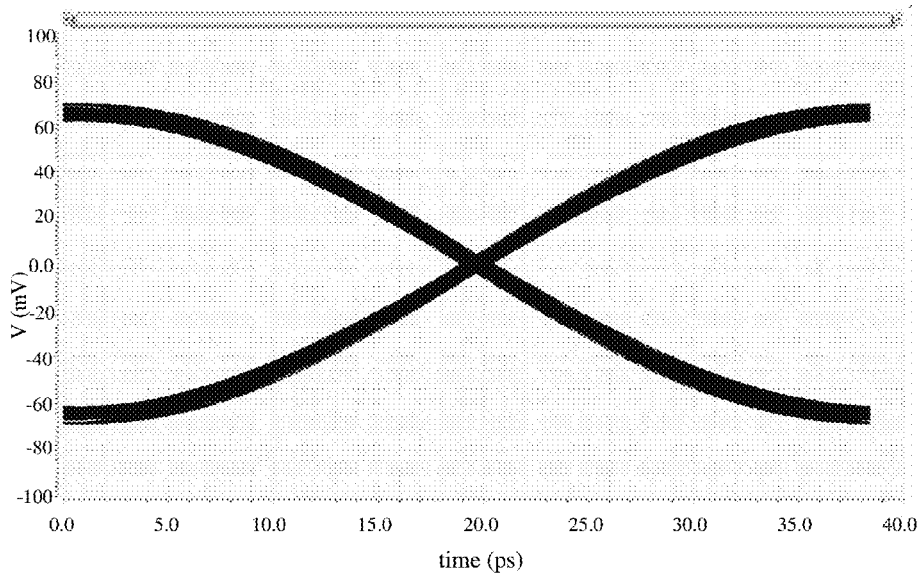

FIG. 8a illustrates the output clock phases ZP and ZN over a quadrant crossing for multiple runs of a simulation for the prior rotator. The reference clock for the rotator is 26 GHz and the output clock is at 1.953 kppm frequency offset (e.g. 26.05 GHz). The jitter in the output signal due to phases glitches at the quadrant transition is clearly demonstrated in this figure. FIG. 8b shows the corresponding results for the OPR described above. The improvement in clock jitter performance is readily apparent.

Figure 9:
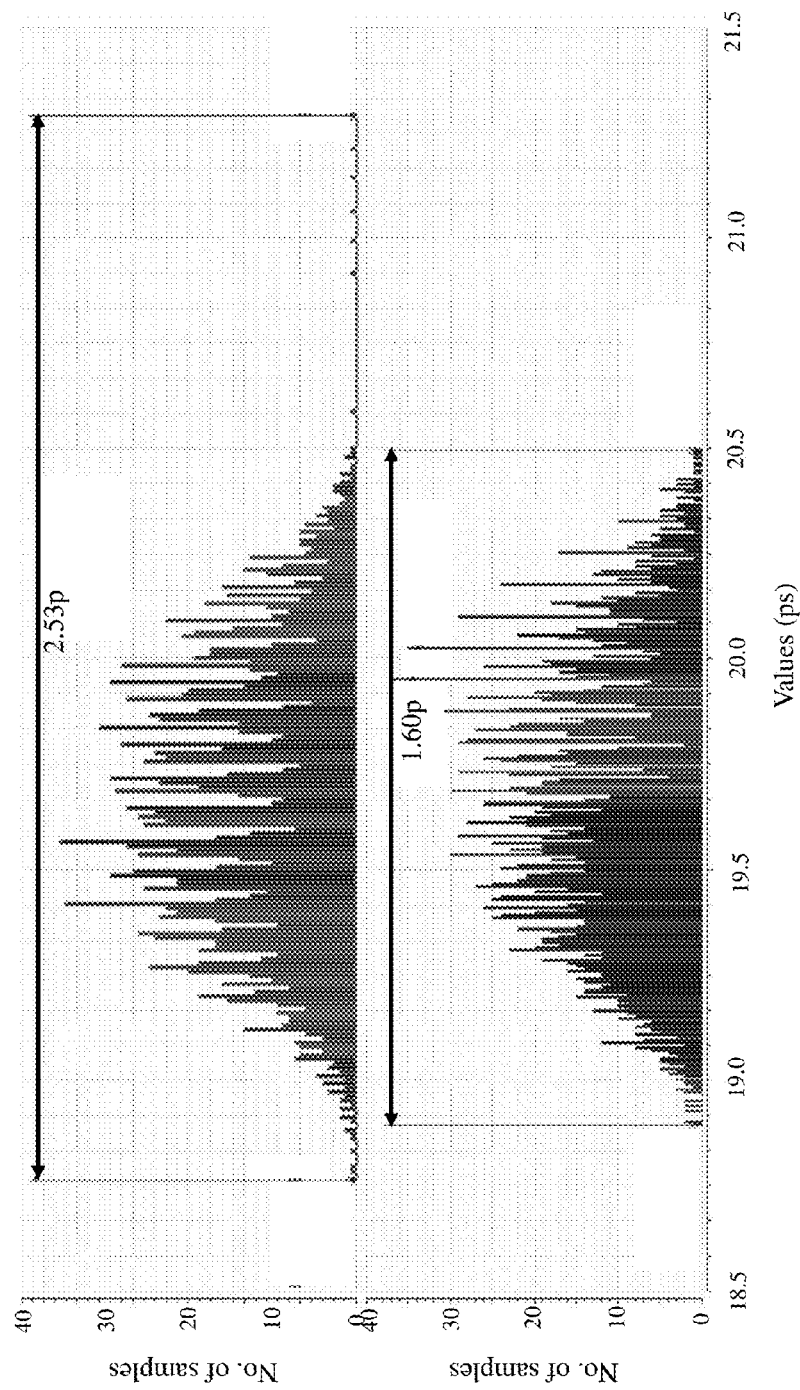
FIG. 9 illustrates peak-to-peak jitter for the two rotators.

FIG. 9 compares clock jitter histograms for the prior rotator (upper diagram) and the above embodiment (lower diagram). Each histogram shows the distribution of values (in picoseconds ps) of samples of the output clock signal, where a sample refers to a single measurement of the clock transition across the zero-voltage level (e.g. clock zero-crossing time) with respect to the ideal time position. Peak-to-peak jitter for the prior rotator was measured as 2.53 ps. This was reduced significantly to 1.60 ps for the OPR 20 above.

It will of course be appreciated that many changes and modifications can be made to the embodiments described above. Different bits of IDAC<0:(k-1)>, or QDAC<0:(k-1)>, could be used to switch more than one pol-I switch or pol-Q switch respectively. Bit allocation need not be the same for the pol-I and pol-Q switches. In general, allocation of control bits to the different polarity switches can be determined to give an efficient layout in an IC (integrated circuit) implementation.

Other embodiments may of course use different current units, and may use other values of n and k. Indeed, the staggered switching system is particularly advantageous in embodiments where n=k (e.g. n=k=8 for a 32-step rotator) since then all polarity switches can be switched separately by different I-DAC or Q-DAC control bits.

Other transistor arrangements for implementing the various switches and amplifiers can be envisaged, and the amplifier sets in the I-, Q- and IQ-mixers could be implemented in various ways. For example, while differential signaling using the differential amplifier configuration described is preferred to reduce effects of noise, single-ended signaling may be employed if desired to reduce power consumption. A single amplifier may then be used in place of each differential pair described above.

While OPR operation is described above with reference to clock signals in an I/O link transceiver circuit, OPRs embodying the invention may be employed in any application which requires conversion from a digital to an analog phase domain.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An octagonal phase rotator apparatus for producing an output signal of phase dependent on a digital control code, the apparatus comprising:
   an I-mixer comprising an I-DAC for steering current between positive and negative phases of an in-phase signal in dependence on k I-DAC control bits of said code, each bit controlling switching of a first current unit between said phases, and a set of amplifiers for receiving said phases of the in-phase signal and weighting each phase, in dependence on current steered to that phase by the I-DAC, to produce a weighted output signal;

a Q-mixer comprising a Q-DAC for steering current between positive and negative phases of a quadrature signal in dependence on k Q-DAC control bits of said code, each bit controlling switching of a said first current unit between said phases, and a set of amplifiers for receiving said phases of the quadrature signal and weighting each phase, in dependence on current steered to that phase by the Q-DAC, to produce a weighted output signal;

an IQ-mixer comprising n IQ-mixer units each comprising an IQ-DAC component for switching a second current unit between said in-phase and quadrature signals, in dependence on a respective bit of n IQ-DAC control bits of said code, and between the positive and negative phases of the in-phase and quadrature signals via I and Q polarity switches respectively of that component, and a set of amplifiers for receiving said phases of said signals and weighting each phase, in dependence on current steered to that phase by the IQ-DAC component, to produce a weighted output signal, wherein the I and Q polarity switches of at least some different IQ-DAC components are arranged to switch in dependence on different I-DAC control bits and Q-DAC control bits respectively; and a summation circuit arranged to sum the weighted output signals from the mixers to produce said output signal.

2. The apparatus as claimed in claim 1 wherein n>k and wherein:

the I polarity switches in k of said IQ-DAC components are arranged to switch in dependence on respective bits of the k I-DAC control bits, and the I polarity switches in the remaining (n−k) IQ-DAC components are arranged to switch in dependence on different bits of the k I-DAC control bits; and the Q polarity switches in k of said IQ-DAC components are arranged to switch in dependence on respective bits of the k Q-DAC control bits, and the Q polarity switches in the remaining (n−k) IQ-DAC components are arranged to switch in dependence on different bits of the k Q-DAC control bits.

3. The apparatus as claimed in claim 1 wherein n≤k and wherein the I and Q polarity switches of all IQ-DAC components are arranged to switch in dependence on different I-DAC control bits and Q-DAC control bits respectively.

4. The apparatus as claimed in claim 3 wherein n=k.

5. The apparatus as claimed in claim 1 including a control code generator connected to the mixers for supplying said control bits to the I-DAC, the Q-DAC and the IQ-DAC components.

6. The apparatus as claimed in claim 1 wherein:

the I-mixer comprises k I-mixer units each comprising an I-DAC component for switching a said first current unit between said positive and negative phases of the in-phase signal, in dependence on a respective bit of the k I-DAC control bits, and a set of amplifiers for receiving said phases of the in-phase signal and weighting each phase, in dependence on current steered to that phase by the I-DAC component, to produce a weighted output signal; and the Q-mixer comprises k Q-mixer units each comprising a Q-DAC component for switching a said first current unit between said positive and negative phases of the quadrature signal, in dependence on a respective bit of the k Q-DAC control bits, and a set of amplifiers for receiving said phases of the quadrature signal and weighting each phase, in dependence on current steered to that phase by the Q-DAC component, to produce a weighted output signal.

7. The apparatus as claimed in claim 6 wherein:

the set of amplifiers in each I-DAC component and each Q-DAC component comprises a pair of differential amplifiers for weighting said positive and negative phases respectively to produce respective differential weighted output signals;

the set of amplifiers in each IQ-DAC component comprises a first pair of differential amplifiers for weighting said positive and negative phases respectively of the in-phase signal to produce respective differential weighted output signals, and a second pair of differential amplifiers for weighting said positive and negative phases respectively of the quadrature signal to produce respective differential weighted output signals; and the summation circuit is arranged to sum the differential weighted output signals from the mixers to produce a differential output signal.

8. The apparatus as claimed in claim 7 including a control code generator connected to the mixers for supplying said control bits to the I-DAC components, the Q-DAC components and the IQ-DAC components.

9. The apparatus as claimed in claim 7 wherein n>k and wherein:

for k of said IQ-DAC components, the I and Q polarity switches thereof are arranged to switch in dependence on respective bits of the k I-DAC control bits and k Q-DAC control bits respectively; and for the remaining (n−k) IQ-DAC components, the I and Q polarity switches thereof are arranged to switch in dependence on different bits of the k I-DAC control bits and k Q-DAC control bits respectively.

10. The apparatus as claimed in claim 7 wherein n=k and wherein the I and Q polarity switches of all IQ-DAC components are arranged to switch in dependence on different I-DAC control bits and Q-DAC control bits respectively.

11. A link transceiver apparatus comprising a transmitter circuit for transmitting data over a link and a receiver circuit for receiving data from the link, wherein each of the transmitter and receiver circuits comprises octagonal phase rotator apparatus for producing an output clock signal of phase dependent on said digital control code, said apparatus comprising:

an I-mixer comprising an I-DAC for steering current between positive and negative phases of an in-phase signal in dependence on k I-DAC control bits of said code, each bit controlling switching of a first current unit between said phases, and a set of amplifiers for receiving said phases of the in-phase signal and weighting each phase, in dependence on current steered to that phase by the I-DAC, to produce a weighted output signal;

a Q-mixer comprising a Q-DAC for steering current between positive and negative phases of a quadrature signal in dependence on k Q-DAC control bits of said code, each bit controlling switching of a said first current unit between said phases, and a set of amplifiers for receiving said phases of the quadrature signal and weighting each phase, in dependence on current steered to that phase by the Q-DAC, to produce a weighted output signal;

an IQ-mixer comprising n IQ-mixer units each comprising an IQ-DAC component for switching a second current unit between said in-phase and quadrature signals, in dependence on a respective bit of n IQ-DAC control bits of said code, and between the positive and negative phases of the in-phase and quadrature signals via I and Q polarity switches respectively of that component, and a set of amplifiers for receiving said phases of said signals and weighting each phase, in dependence on current steered to that phase by the IQ-DAC component, to produce a weighted output signal, wherein the I and Q polarity switches of at least some different IQ-DAC components are arranged to switch in dependence on different I-DAC control bits and Q-DAC control bits respectively;

a summation circuit arranged to sum the weighted output signals from the mixers to produce said output signal; and a control code generator connected to the mixers for supplying said control bits to the I-DAC, the Q-DAC and the IQ-DAC components.

12. The link transceiver apparatus as claimed in claim 11 wherein n>k and wherein:
the I polarity switches in k of said IQ-DAC components are arranged to switch in dependence on respective bits of the k I-DAC control bits, and the I polarity switches in the remaining (n−k) IQ-DAC components are arranged to switch in dependence on different bits of the k I-DAC control bits; and
the Q polarity switches in k of said IQ-DAC components are arranged to switch in dependence on respective bits of the k Q-DAC control bits, and the Q polarity switches in the remaining (n−k) IQ-DAC components are arranged to switch in dependence on different bits of the k Q-DAC control bits.

13. The link transceiver apparatus as claimed in claim 11 wherein n≤k and wherein the I and Q polarity switches of all IQ-DAC components are arranged to switch in dependence on different I-DAC control bits and Q-DAC control bits respectively.

14. The link transceiver apparatus as claimed in claim 13 wherein n=k.

15. The link transceiver apparatus as claimed in claim 11, wherein the I-mixer comprises k I-mixer units, each I-mixer unit comprising an I-DAC component for switching a said first current unit between said positive and negative phases of the in-phase signal, in dependence on a respective bit of the k I-DAC control bits, and a set of amplifiers for receiving said phases of the in-phase signal and weighting each phase, in dependence on current steered to that phase by the I-DAC component, to produce a weighted output signal; and
the Q-mixer comprises k Q-mixer units each, Q-mixer unit comprising a Q-DAC component for switching a first current unit between said positive and negative phases of the quadrature signal, in dependence on a respective bit of the k Q-DAC control bits, and a set of amplifiers for receiving said phases of the quadrature signal and weighting each phase, in dependence on current steered to that phase by the Q-DAC component, to produce a weighted output signal.

16. The link transceiver apparatus as claimed in claim 15 wherein the set of amplifiers in each I-DAC component and each Q-DAC component comprises:
a pair of differential amplifiers for weighting said positive and negative phases respectively to produce respective differential weighted output signals;
the set of amplifiers in each IQ-DAC component comprises a first pair of differential amplifiers for weighting said positive and negative phases respectively of the in-phase signal to produce respective differential weighted output signals, and a second pair of differential amplifiers for weighting said positive and negative phases respectively of the quadrature signal to produce respective differential weighted output signals; and
the summation circuit is arranged to sum the differential weighted output signals from the mixers to produce a differential output signal.

* * * * *